(12) United States Patent
Wu et al.

(10) Patent No.: US 8,498,128 B2
(45) Date of Patent: Jul. 30, 2013

(54) PRINTED CIRCUIT BOARD

(75) Inventors: Ning Wu, Shenzhen (CN); Hsin-Kuan Wu, Taipei Hsien (TW); Hou-Yuan Chou, Taipei Hsien (TW); Shun-Bo Bai, Shenzhen (CN); Yan-Mei Zhu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 290 days.

(21) Appl. No.: 12/916,615

(22) Filed: Oct. 31, 2010

(65) Prior Publication Data
US 2012/0051001 A1    Mar. 1, 2012

(30) Foreign Application Priority Data
Aug. 31, 2010   (CN) .......................... 2010 1 0267987

(51) Int. Cl.
*H05K 7/02* (2006.01)
*H05K 7/06* (2006.01)
*H05K 7/08* (2006.01)
*H05K 7/10* (2006.01)

(52) U.S. Cl.
USPC ........... 361/760; 361/763; 361/764; 361/793; 361/794; 361/795; 174/260; 174/262

(58) Field of Classification Search
USPC ... 361/760–764, 803, 784–795; 174/259–265
See application file for complete search history.

(56) References Cited

U.S. PATENT DOCUMENTS

| | | | | |
|---|---|---|---|---|
| 5,371,653 A * | 12/1994 | Kametani et al. | ............. | 361/721 |
| 5,719,750 A * | 2/1998 | Iwane | ............. | 361/794 |
| 5,912,809 A * | 6/1999 | Steigerwald et al. | ......... | 361/780 |
| 6,002,593 A * | 12/1999 | Tohya et al. | .................. | 361/765 |
| 6,084,779 A * | 7/2000 | Fang | .................. | 361/763 |
| 6,297,965 B1 * | 10/2001 | Sasaki et al. | .................. | 361/782 |
| 6,515,868 B1 * | 2/2003 | Sasaki et al. | .................. | 361/760 |
| 7,544,899 B2 * | 6/2009 | Kamada et al. | .............. | 174/260 |
| 8,004,854 B2 * | 8/2011 | Kucharski | .................... | 361/780 |

* cited by examiner

*Primary Examiner* — Tuan T Dinh
(74) *Attorney, Agent, or Firm* — Altis Law Group, Inc.

(57) ABSTRACT

A PCB includes a number of insulation layers, a number of circuit layers, a signal-interfering component, and a signal-sensitive component. The circuit layers and the insulation layers are stacked alternately. The circuit layers include at least two first circuit layers, a second circuit layer, and a ground layer. The ground layer has a first side and a second side facing away the first side. The first circuit layers are positioned near the first side and include an outmost first circuit layer and at least one inner first circuit layer positioned between the outmost first circuit layer and the ground layer. The second circuit layer is positioned near the second side. The signal-interfering component is positioned on the outmost first circuit layer. The signal-sensitive component is positioned on the second circuit layer. Each inner first circuit layer defines a copper-remove area corresponding to an orthogonal projection of the signal-interfering component thereon.

3 Claims, 2 Drawing Sheets

PRINTED CIRCUIT BOARD

BACKGROUND

1. Technical Field

The present disclosure relates to a printed circuit board (PCB).

2. Description of Related Art

A pulse width modulation (PWM) circuitry can be formed on a PCB for providing pulse signals. The PWM circuitry requires high-speed alternating current during operation to generate powerful electromagnetic waves. It is not uncommon for a signal-sensitive source, such as voltage reference circuitry to be included and arranged close to the PWM circuitry and thus be susceptible to electromagnetic interference from the PCB.

Therefore, it is desirable to provide a PCB that can overcome the limitations described.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
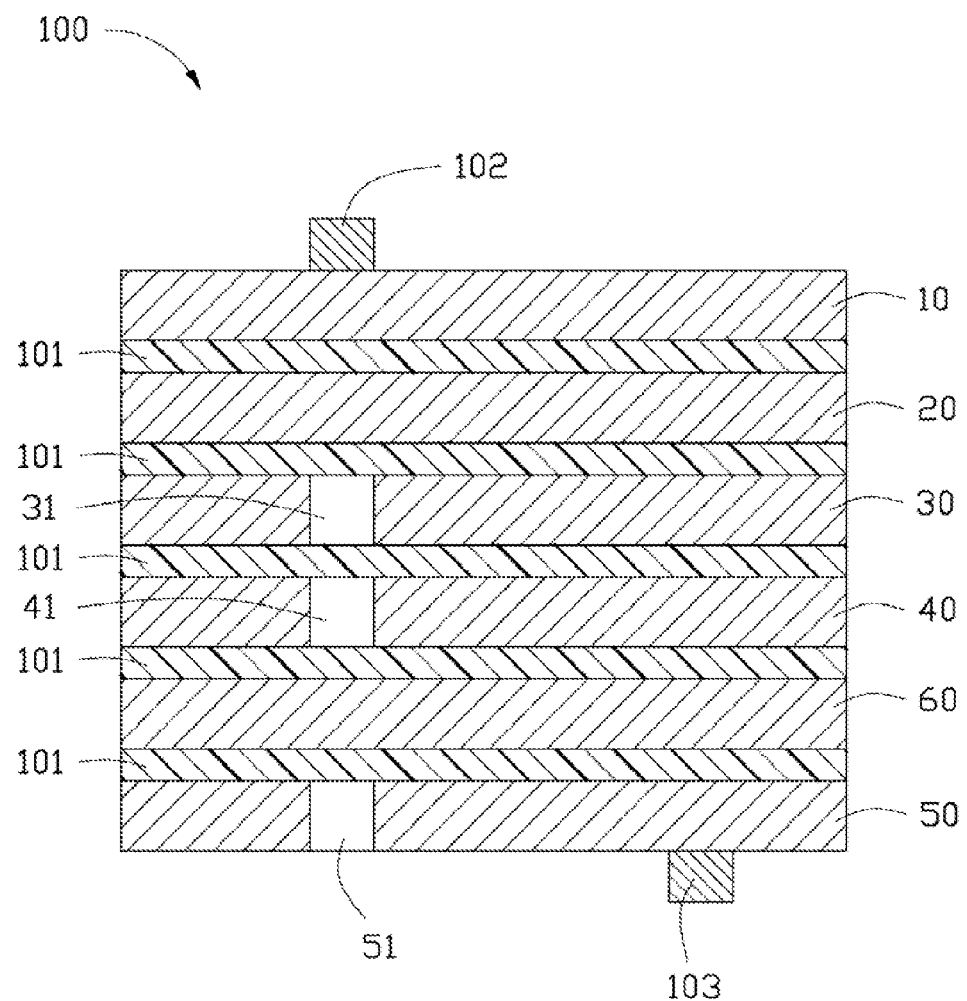
FIG. 1 is a cross-section of a PCB, according to an exemplary embodiment.

Referring to FIG. 1, a PCB 100, according to an exemplary embodiment, includes six circuit layers, five insulation layers 101, a signal-interfering component 102, and a signal-sensitive component 103. The circuit layers and the insulation layers 101 are stacked alternately and one insulation layer 101 is laid between every two adjacent circuit layers. The six circuit layers are four first circuit layers 10, 20, 30, 40, a second circuit layer 50, and a ground layer 60. The ground layer 60 includes a first side and a second side facing away the first side. The four first circuit layers 10, 20, 30, 40 are disposed on the first side in this order from a far end to a near end. The second circuit layer 50 is disposed on the second side.

The signal-interfering component 102 (such as a PWM circuitry) includes a first portion and a second portion electrically connected thereto. The first portion includes a number of electrical elements (such as capacitance, resistance, inductance) positioned on the first circuit layer 10. The second portion includes a number of signal traces layered on the first circuit layer 20. The signal-sensitive component 103 such as a voltage reference circuitry is positioned on the second circuit layer 50 and away from an orthogonal projection of the signal-interfering component 102 on the second circuit layer 50. In other embodiments, the signal-interfering component 102 also can be at least one high-speed signal transmission line. The signal-sensitive component 103 also can be a universal serial bus (USB) circuitry or a video graphics array (VGA) circuitry.

The first circuit layers 30 and 40 host a number of signal transmission lines (not shown) away from orthogonal projections of the signal-interfering component 102 on the first circuit layers 30 and 40. The first circuit layers 30 and 40 define a first copper-removed area 31 and a second copper-removed area 41 corresponding to the orthogonal projections of the signal-interfering component 102 on the first circuit layers 30 and 40. The first circuit layer 10 and the ground layer 60 cooperatively form a first parallel plate condenser therebetween. According to a formula $$C = \frac{K\xi S}{d},$$

wherein C is the capacitance of the first parallel plate condenser, K is a constant, $\xi$ is a dielectric constant, S is the area of the facing surfaces of the two polar plates of the condenser, d is the distance between the two polar plates, when d increases, then C will decrease. Also considering a formula of the capacitive reactance of the parallel plate condenser:

$$X_C = \frac{1}{wC},$$

wherein $X_C$ is the capacitive reactance of the parallel plate condenser, w is the frequency of an alternating current ran through the parallel plate condenser. When C decreases, then $X_C$ increases. Therefore, the electromagnetic wave generated by the signal-interfering component 102 is blocked to be transported to the ground layer 60, and accordingly the electromagnetic waves are blocked to be transported to the signal-sensitive component 103. Thus, the interference of the signal-interfering component 102 to the signal-sensitive component 103 is reduced or even eliminated.

The second circuit layer 50 defines a third copper-removed area 51 corresponding to an orthogonal projection of the signal-interfering component 102 on the second circuit layer 50. Because the propagation speed of electromagnetic waves is highest in the air, the electromagnetic waves are transported thereby and not by a second parallel plate condenser formed by the ground layer 60 and the second circuit layer 50. Accordingly, influence of the electromagnetic waves on the signal-sensitive component 103 is minimal.

Figure 2:
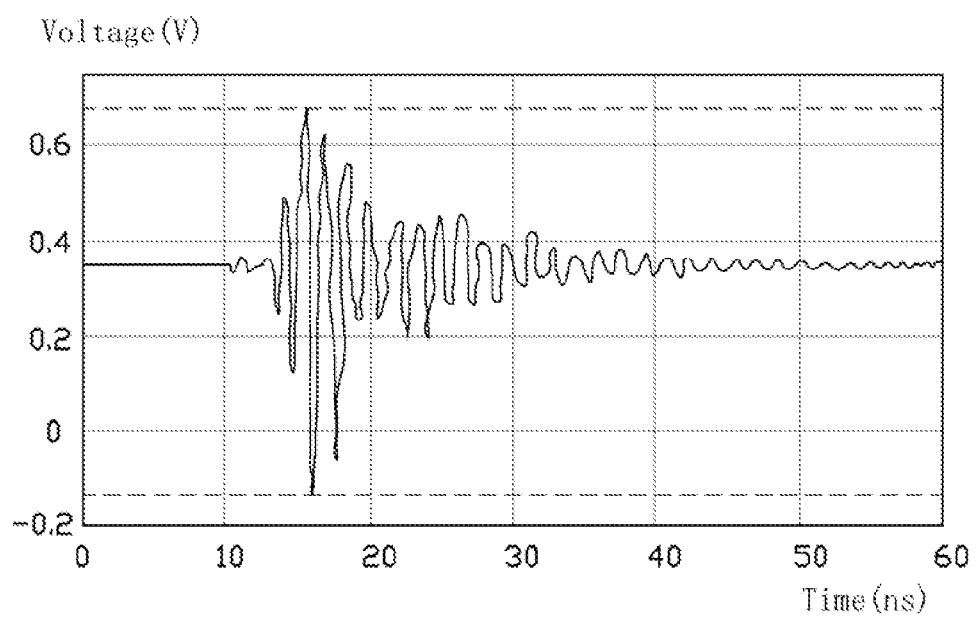
FIG. 2 is a voltage fluctuation waveform simulation graph of a signal-sensitive source on the PCB of FIG. 1.

Referring to FIG. 2, the differential voltage of the PCB is about 11.2659 mV. That is to say, the voltage of the signal-sensitive component 103 is formed in a relativity stable range, and interference of the signal-interfering component 102 to the signal-sensitive component 103 is low.

It can be understood, because in the present embodiment, the signal-interfering component 102 is a PWM circuitry which generates considerable heat during operation, if the PWM circuitry is only disposed on a first circuit layer 10, the heat will not be dissipated quickly and can collect on the first circuit layer 10, causing damage thereto and influencing other elements on the first circuit layer 10. If the signal-interfering component 102 generates a little heat, it can be only disposed on a first circuit layer 10.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:
1. A printed circuit board (PCB), comprising:
   five insulation layers;

six circuit layers, wherein the insulation layers and the circuit layers are stacked alternately; one insulation layer is positioned between two adjacent circuit layers, the circuit layers comprise four first circuit layers, a ground layer and a second circuit layer, the ground layer comprises a first side and a second side facing away from the first side, the first circuit layers are positioned on the first side and comprise an outmost first circuit layer and three inner first circuit layers positioned between the outmost first circuit layer and the ground layer, and the second circuit layer are positioned on the second side;

a signal-interfering component positioned on the outmost first circuit layer away from the ground layer; and a signal-sensitive component positioned on the second circuit layer;

wherein each of two of the three inner first circuit layers except the inner first circuit layer adjacent to the outmost first circuit layer defines a copper-remove area under the signal-interfering component.

2. The PCB of claim 1, wherein the signal-sensitive component is positioned on the second circuit layer and away from an orthogonal projection of the signal-interfering component on the second circuit layer.

3. The PCB of claim 2, wherein the second circuit layer defines a copper-removed area corresponding to the orthogonal projection of the signal-interfering component on the second circuit layer.

* * * * *